United States Patent [19]

Hamilton

[11] Patent Number: 4,900,948
[45] Date of Patent: Feb. 13, 1990

[54] APPARATUS PROVIDING SIGNALS FOR BURN-IN OF INTEGRATED CIRCUITS

[75] Inventor: Harold E. Hamilton, Minneapolis, Minn.

[73] Assignee: Micro Control Company, Minneapolis, Minn.

[21] Appl. No.: 168,875

[22] Filed: Mar. 16, 1988

[51] Int. Cl.⁴ .................. H02J 7/00; G01R 15/12; H05K 1/11
[52] U.S. Cl. .................. 307/149; 324/158 F; 324/73.1; 361/412; 361/413; 361/415
[58] Field of Search .................. 307/149; 324/73 PC, 324/158 F; 361/412, 413, 415; 174/117 PC

[56] References Cited

U.S. PATENT DOCUMENTS

| | | | |
|---|---|---|---|
| 3,147,054 | 9/1964 | Alexander et al. | 339/17 |
| 3,736,471 | 5/1973 | Donze et al. | 317/101 D |
| 4,132,948 | 1/1979 | Katz | 324/158 F |
| 4,145,620 | 3/1979 | Dice | 307/149 |
| 4,374,317 | 2/1983 | Bradshaw | 219/385 |
| 4,468,616 | 8/1984 | Yoshizaki | 324/158 F |
| 4,514,786 | 4/1985 | Charruau | 361/413 |
| 4,516,071 | 5/1985 | Buehler | 324/158 R |
| 4,636,726 | 1/1987 | Santomango et al. | 324/158 F |

OTHER PUBLICATIONS

Micro Control Company Publication No. A-000026 entitled "Burn-In and Environmental Test Systems" (1984).
Micro Control Company Publication No. 990078 entitled "A Description of the Automatic Burn-In and Environmental System (ABES)" (1987).

Primary Examiner—William M. Shoop, Jr.
Assistant Examiner—Sharon D. Logan
Attorney, Agent, or Firm—Kinney & Lange

[57] ABSTRACT

A burn-in board construction mounts and provides operational signals to circuit packages, for example, digital devices in an environmental stress operation such as in an oven/chamber for dynamic burn-in. Each of the circuit packages has connections to circuits and which connections are connected to conductors on the burn-in board. At least one auxiliary board is mounted on a main burn-in board and carries contacts to double the number of test connections for digital devices on such burn-in board without changing the basic mounting or environmental chamber construction. The construction permits two 128 pin driver/receiver boards of standard design to be connected to each burn-in board module. This permits coupling several hundred driver connections to a single burn-in board while still utilizing standard connectors as the interconnects.

10 Claims, 4 Drawing Sheets

APPARATUS PROVIDING SIGNALS FOR BURN-IN OF INTEGRATED CIRCUITS

BACKGROUND OF THE INVENTION

1. Field of the Invention.

The present invention relates to an arrangement for connecting discrete circuit packages for burn-in in an automatic burn-in environmental system requiring a large number of connections to a burn-in board using standard connectors and environmental chambers.

2. Description of the Prior Art.

Typical automatic burn-in and environmental systems are manufactured by Micro Control Company, the assignee of the present application, having an office at 7956 Main Street N.E., Minneapolis, Minn. 55432. An existing system is described in Micro Control Company Publication No. 990078, which shows a typical environmental chamber and describes various specifications for driver/receiver boards utilizing existing 128 contact card edge connectors between the driver/receiver boards and the "burn-in boards" that are utilized for supporting or mounting the digital devices to be tested.

Additionally, various environmental chamber test equipment has been advanced. For example, a large burn-in system is shown in U.S. Pat. No. 4,636,726, which discloses a large rack installation. This patent explains typical types of tests that are conducted.

Donze et al., U.S. Pat. No. 3,736,471, shows a card connector arrangement that includes a principal board 11, and a pair of card planes 12 for removable connection with the principal board. This assembly is not used for burn-in, and does not have the unique features of the present invention which provides a parallel connecting arrangement for use with existing card edge connectors to increase the number of connections that can be made to a single burn-in board simply and at low cost.

U.S. Pat. No. 4,468,616 shows testing equipment for electronic components, that has a type of an interconnecting board or span board between the burn-in boards and driver boards. The burn-in boards are shown at 12, and the driver boards are shown at 13, and a printed wire board 15 that has a plane that is perpendicular to the planes of the driver boards and burn-in boards carries paired spaced connectors or jacks 16 and 17. The paired spaced jacks are connected by conductor pins 20. This is therefore a transition board to carry the connections between the driver board and the burn-in boards in an environmental chamber in which the burn-in boards are mounted.

A modular, dynamic burn-in apparatus of typical design is also shown in U.S. Pat. No. 4,145,620, which discloses a rack that goes into a large environmental chamber.

U.S. Pat. No. 3,147,054 to Alexander et al. shows a test point extender for circuit boards that has a wrap-around sheet that folds around a circuit board so a fold line of the sheet as at one edge of the circuit board and both ends of the folded sheet are at the opposite edge of the circuit board. The sheet has conductors that engage contacts on the one end of the board (where the fold is) and which carry electrical signals back to the connectors on the wraparound sheet at the other end of the circuit board from the test connections. This is for making the normal connections to a circuit board at an opposite end of the board from the contacts on the board.

Additional examples of support devices and testing apparatus are shown in U.S. Pat. Nos. 4,132,948; 4,514,786; and 4,516,071.

The abstract of German Publication No. 2811775 briefly describes a testing device for printed circuits which uses test probes.

A typical environmental chamber is shown in U.S. Pat. No. 4,374,317, which illustrates a typical slotted wall through which ends of burn-in boards pass for test connections on the exterior of the environmental chamber.

SUMMARY OF THE INVENTION

The present invention relates to a burn-in system that provides burn-in boards that have parallel edge connectors to permit doubling the number of driver/receiver boards that can be connected to one burn-in board for testing electronic circuit package, components, primarily digital devices such as VLSI chips, without modifying or changing from standard edge connectors on the driver/receiver boards and without changing the construction of environmental chambers used for the burn-in system.

Many of the standard ovens or environmental chambers that are used for testing have slots in one wall thereof through which the edges of the burn-in boards extend to the exterior for making connections to the circuit packages on the burn-in board. A narrow temperate zone or chamber is included in some environmental chambers adjacent to one wall of the environmental chamber (which normally is an oven). The temperate chamber is defined by a second wall spaced from the environmental chamber wall, and the edges of the burn-in board which carry the contacts for connection to conditioning and control circuitry span this temperate chamber so that the edge connectors utilized not only are on the exterior of the environmental chamber wall but are spaced from the environmental chamber wall by a distance that provides for a substantial reduction in temperature at the connectors. The second wall forming the temperate chamber also has slots in it. Burn-in boards extending through slots of the environmental chamber wall from the interior of the environmental chamber also extend across the temperate chamber and through the slots in the second wall to the exterior where the burn-in boards are coupled to standard multiple contact card edge connectors or jacks. In turn, the burn-in board contacts are coupled through the edge connectors to selected driver/receiver boards that are supported relative to the environmental chamber.

In the present invention, existing driver/receiver (stimulation and control) boards, which are used for providing controlled, programmed standard signals to stimulate the contacts on the circuit packages and receiving return signals from the digital devices thereon have a set number of edge contacts that are coupled to the burn-in board through the standard card edge jacks or connectors. The edge jacks or connectors generally are provided with 100 pins each for a total of 200 pins when two connectors are used. In a standard driver/receiver board, 128 of these pins are used as driver-receiver connections on the burn-in board using two vertically aligned edge connectors. The rest of the pins are used for miscellaneous purposes, such as ground and control lines.

In the present invention, an auxiliary board is mounted on a main burn-in board which has the circuit packages, either analog or digital devices mounted thereon, but is spaced from the main burn-in board and extends parallel to the main board. The auxiliary board also extends from the interior of the environmental chamber and across the temperate chamber (if one is present) to the exterior. The auxiliary board has the same number of contacts on its outer edge as that of a standard driver/receiver board.

The auxiliary board is spaced from the burn-in board on which it is mounted by the standard spacing used for the slots in the environmental chamber through which the burn-in boards extend to the exterior. The contacts on the auxiliary board, which as stated is parallel to the burn-in board, are connected to suitable conductors on the auxiliary board and the conductors are jumpered to terminals or conductors on the main burn-in board for connection to circuit packages. Thus, double the number of connections from driver/receiver boards can be made to one burn-in board without changing the connectors, the board mountings, or the environmental chamber orientation, and without changing the driver/receiver boards that are used.

This permits a low cost increase in the number of circuit packages that can be mounted on one burn-in board and increases the capability for the program that can be carried out on the circuit packages that are mounted on a burn-in board. The assembly permits using existing environmental chambers, so that the size of the chamber for supporting both the burn-in boards and the driver/receiver boards does not have to change, and standard driver/receiver boards can also be used for providing a controlled program for stimulating the connections of circuits in the circuit packages on the burn-in board.

DETAILED DESCRIPTION OF THE PREFERRED EMBODIMENTS

In the present description, the interconnections and devices are shown schematically, to illustrate the principles of the invention. As previously stated, publications of Micro Control Company, 7956 Main Street N.E., Minneapolis, Minn. 55432, the assignee of the present invention, show prior burn-in systems. For example, Publication No. 990078 includes such a showing, as does its Publication No. A-000026. In the last mentioned publication, which is a brochure entitled "Burn-In and Environmental Test Systems", photographic representations of typical high speed driver/receiver boards and fully assembled standard burn-in boards are shown. Also shown therein is a typical system block diagram for testing. The circuit stimulation sequence and type can be controlled to be any desired arrangement, utilizing the present invention.

Figure 1:
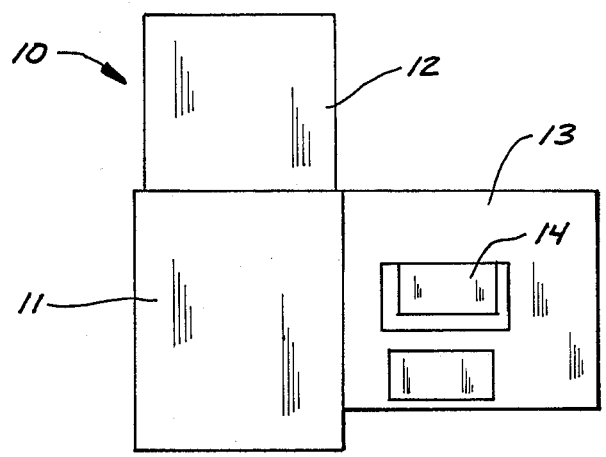
FIG. 1 is a top plan view of a typical environmental system in which the burn-in boards of the present invention can be used.
Figure 2:
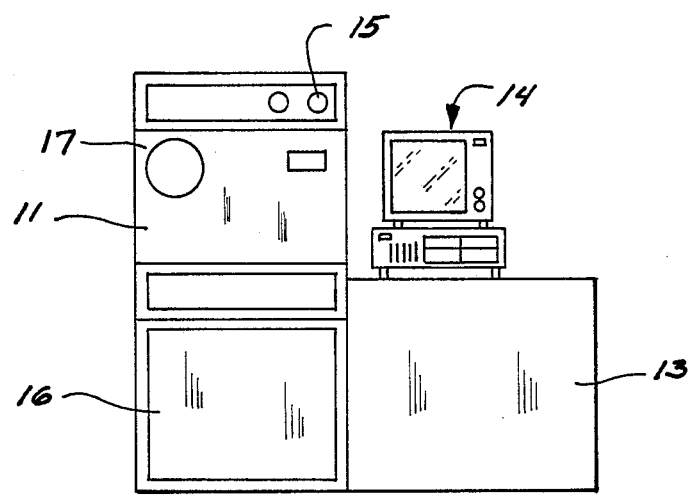
FIG. 2 is a front schematic elevational view of the environmental system of FIG. 1.

Referring to FIG. 1, an environmental test system is shown generally at 10 and includes a main environmental chamber housing or oven 11, a driver/receiver loading chamber housing 12, and a console assembly 13 on which a control computer 14 is supported. The control computer 14 has the necessary programs for controlling the driver/receiver boards mounted in the loading chamber housing 12, to provide for the tests to be conducted on circuit packaging which can be analog or digital, but which will be primarily digital devices, such as VLSI chips, connected on burn-in boards in the environmental chamber housing 11. The environmental chamber housing 11 in front view, shows a loading door 17, with suitable environmental temperature controls 15 thereon, along with desired indicators. The environmental chamber housing has an interior chamber that can be temperature and humidity controlled. A power supply rack 16 is used for supporting the environmental chamber housing 11. This compact arrangement can be driven with a personal computer such as that shown at 14 to control and program the signals to the circuit packages on the various burn-in boards. As will be seen, a plurality of burn-in boards can be placed in an interior environmental chamber in housing 11.

Figure 3:
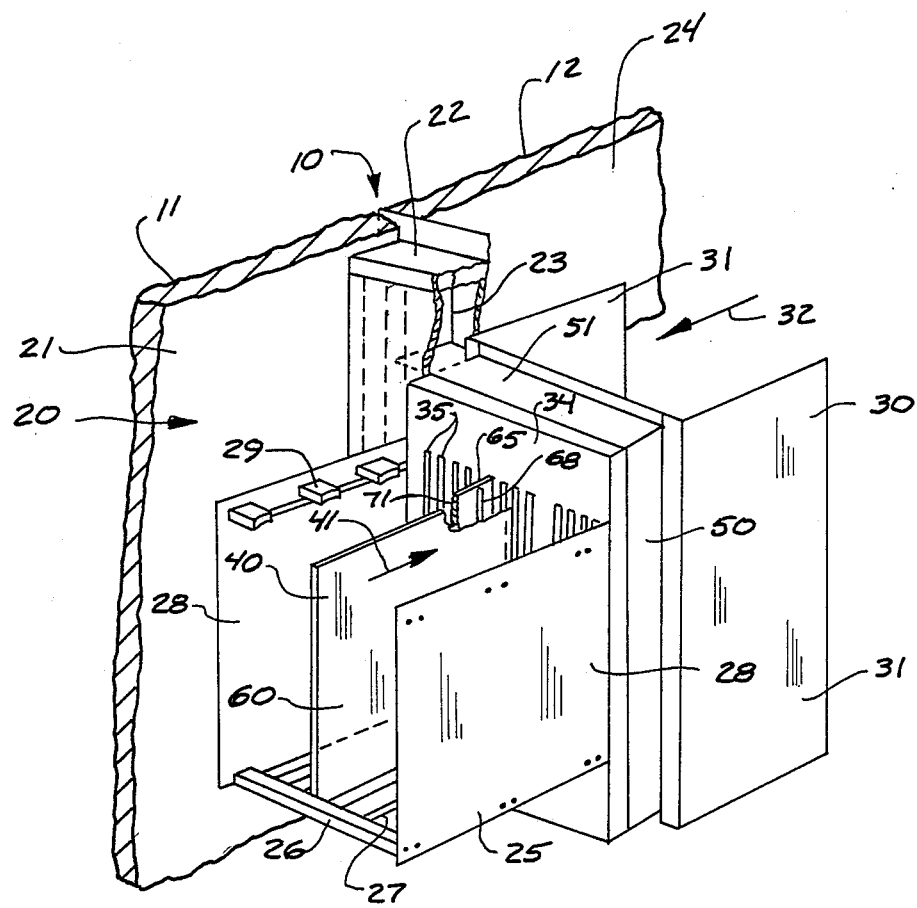
FIG. 3 is a perspective view of typical interior and exterior board or card cages used for supporting burn-in boards and the driver/receiver boards, with a typical burn-in board made according to the present invention illustrated schematically in place.

For orientation purposes, the conventional burn-in board chamber and loading chamber of the system 10 is shown in FIG. 3, with the exterior walls broken away to show the interior cages for supporting the boards. As can be seen, the environmental chamber housing 11 defines an interior heated environmental chamber 20, surrounded by side walls 21 arranged in a desired manner. At the end of the interior chamber 20 opposite from the loading door 17 a housing 22 is positioned. Housing 22, as shown, forms a temperate zone or chamber 23 that separates the burn-in board interior environmental chamber 20 from the driver/receiver board chamber 24 of the load chamber housing 12. The schematic showing includes a burn-in board rack indicated generally at 25 (also called a card cage), which is within the interior environmental chamber 20 of the environmental chamber housing 11. The rack 25 has a bottom wall 26 and suitable guide members shown at 27 therein for receiving the edges of burn-in boards, or, if desired, for receiving separate loading racks holding several burn-in boards. The rack 25 has side walls 28,28 that mount suitable components such as that shown at 29 for supporting the burn-in boards in the proper orientation.

The driver/receiver board chamber 24 has an exterior card cage or rack 30 mounted therein in a suitable manner on the interior of the walls forming the loading chamber housing 12. The exterior driver/receiver board rack or cage 30 has side walls 31 that are used for guiding and supporting a bottom wall 31A (FIG. 4) that will support driver/receiver boards of conventional design as they are inserted in direction as indicated by the arrow 32.

The temperate zone housing 22 is defined by an end environmental chamber wall 34 that has slots 35 defined therein, and these slots 35 are of size to receive a burn-in board assembly shown at 40 that is supported in a suitable guide 27, and is slid in direction as indicated by the arrow 41 from the front of the burn-in chamber 11. The end portions of the burn-in board assembly which has contacts thereon for connection to driver/receiver boards is slid through the slots 35, and across the temperate zone chamber 23 and then through additional slots shown in FIG. 5 at 44, in a rear wall assembly 43 of the temperate zone housing 22.

The temperate zone housing 22 is constructed so there will be a sealing gasket of rubber material on the planar side surfaces of each of the burn-in board portions that pass through the respective slots. The end wall 34 of the environmental chamber is made of a sandwich construction comprising a pair of sheets or layers 34A of rigid to semi-rigid material, and a central silicon rubber sheet 34B (or other flexible sealing material) sandwiched between sheets 34A and held in place. The silicon rubber material 34B has slits aligning with the respective slots 35 which are formed in the sheets 34a. The edge of the slots in the sheets 34A are spaced enough so the portion of the rubber sheet adjacent the slot edges will be permitted to yield sufficiently to permit a flat, generally narrow board, such as a burn-in board, to slide through the slit. The rubber forming the sides of the slit resiliently engages the sides of such a planar board to seal against the board side surfaces.

The wall 43 is made in the same way with outer panels or sheets 43A sandwiching a silicon rubber sheet 43B that has slits aligning with the slots 44. The edges of the slits in the rubber sheet sides will yield and seal against a board slid through the slot. The temperate zone housing does have side walls 50, and a top wall 51 and a bottom wall 51A for enclosing the temperate chamber and keeping such temperate chamber isolated from the interior environmental chamber 20 and from the exterior as well. The walls 21 for example, forming the environmental chamber 20 can be made of a suitable insulating material, as desired, and are shown only schematically.

Standard card edge connectors or jacks shown schematically at 52 are mounted onto driver/receiver boards 55 to the outer side of the wall 43 that is the exterior wall of the environmental system. The connectors 52 have receptacles and contacts for receiving the edges of circuit cards or boards. The connectors 52 are positioned to have the receptacles align with the exterior of the slots 44. The contacts in the connectors 52 are connected to conductors on the driver/receiver boards 55 and are fixed to the edge of the driver/receiver boards. The driver/receiver boards are supported on the card or board support rack 30. Generally, there are vertically stacked pairs of jacks or connectors 52, and in the typical environmental chamber system shown in FIG. 3 the vertical length of the slots 44, is such that two connectors 52 are aligned with each slot and provide for 128 board edge contacts to be connected at each of the slots.

Driver/receiver boards 55 are thus presently made up to provide for 128 contacts for burn-in purposes, and in addition are made to transfer power through separate connectors to power the burn-in boards and the components that are present on the burn-in boards.

Burn-in board assembly 40 of the present form of the invention comprises a first generally planar circuit board or card 60 that is made of a suitable material, and which has connector receptacles for receiving pairs of a plurality of circuit packages or components shown at 61 schematically. The circuit packages may be various dual inline packages such as ROM, RAM, PROM, EPROM, SSI, MSI, LSI AND VLSI devices. Generally speaking, the VLSI devices are ones which require a high number of connectors or pins for burn-in. Special drivers, multiplexers, device loads and the like can be applied from the driver/receiver boards. In order to utilize the high performance signal providing systems necessary, it requires several hundred driver/receiver connections to the circuit package components on the burn-in board.

In order to utilize existing card edge connectors 52 as the interconnection devices, when having a larger number of required connections on the burn-in board the board assembly 40 has an auxiliary connector board 65, also made of a suitable material, which is positioned spaced from the main or first board 60 and which is fixedly mounted on the board 60. The auxiliary board 65 is parallel to the main board 60. The auxiliary board 65 is substantially identical in vertical height and thickness dimensions to the end portion of the main board 60, and has suitable edge contacts 66 thereon on one edge thereof, which are positioned to mate with the existing circuit card edge connectors 52.

The auxiliary board 65 is fixedly supported on the main board 60 with a mounting strip or block 68 that is fixed to the main board 60 and positions the auxiliary board 65 at a spacing from the plane of the main board 60 equal to the spacing between the slots 35 and thus equal to the spacing between the slots 44 formed in walls 34 and 43, respectively.

The edge contacts 66 on auxiliary board 65 are connected to suitable printed wire conductors 70, which are formed on the auxiliary board 65, and at the inner edge 71 of the auxiliary board 65, there are flexible jumpers 72 electrically and mechanically connected to each of the printed conductors 70, and in turn, the jumpers 72 are soldered or connected to suitable terminals 73 on the main board 60. The main board 60 has printed wire conductors 76 thereon which are electrically connected to individual contacts 74 on the edge of the main board 60 extending into slots 44, thus some printed wire conductors on board 60 are connected to contacts 74 and some are connected through jumpers 72 and edge contacts 66 on auxiliary board 65.

By having the edge contacts 66 spaced at the same spacing as edge contacts 74 on the connecting edge of main board 60 (see FIG. 4 where the auxiliary board 65 is broken away), the same standard edge connectors 52 can be used for both the main board 60 and auxiliary board 65 for connection simultaneously through the circuit edge connectors 52 at adjacent slots 44. More than one auxiliary board can be used on each main burn-in board. For example, there can be an auxiliary board on each side of the main board.

The auxiliary boards permit the connection of two (or more) driver/receiver boards 55A and 55B, to the same burn-in board assembly 40 to stimulate the contacts of the circuit package or components 61 on this burn-in board assembly in a desired manner using the added number of connections from at least two separate driver/receiver boards such as those shown at 55A and 55B.

The driver/receiver boards 55A and 55B provide for the necessary coupling from various operational and control components thereon, which are shown only schematically at 75, and these then in turn can be connected and programmed to provide signals to the circuit packages 61 through suitable controls 79 operated from the microcomputer or personal computer 77, as programmed with suitable software 78.

Figure 5:
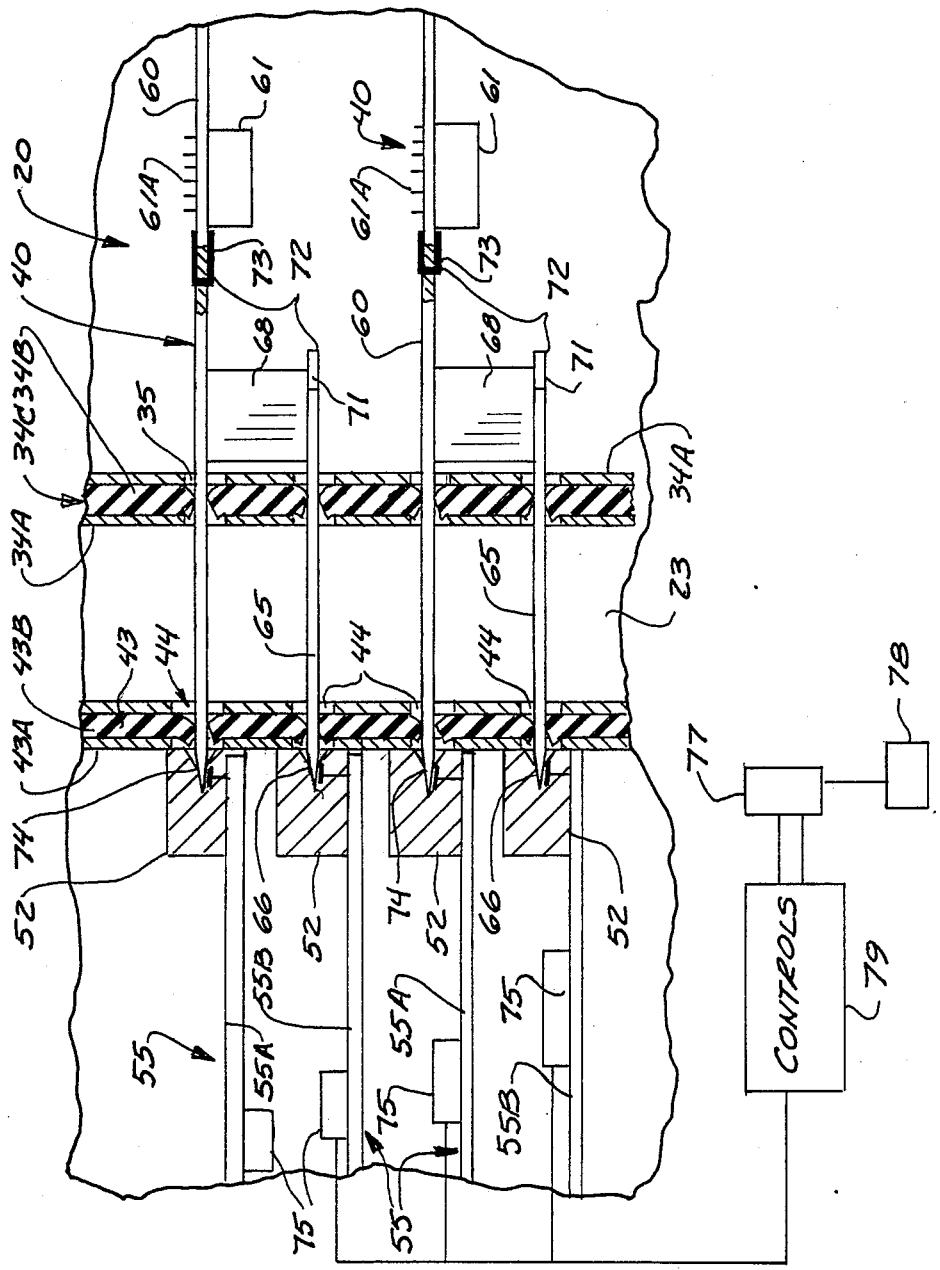
FIG. 5 is a top sectional view taken generally along lines 5—5 in FIG. 4.

The particular operation sequence being conducted on the circuits in the circuit packages 61 can be selected by the user, and the individual connections or connecting pins of each of the circuit packages 61, which are shown at 61A in FIG. 5, then can be connected to receive signals through separate conductors and connectors, including conductors to the desired driver/receiver boards.

Figure 4:
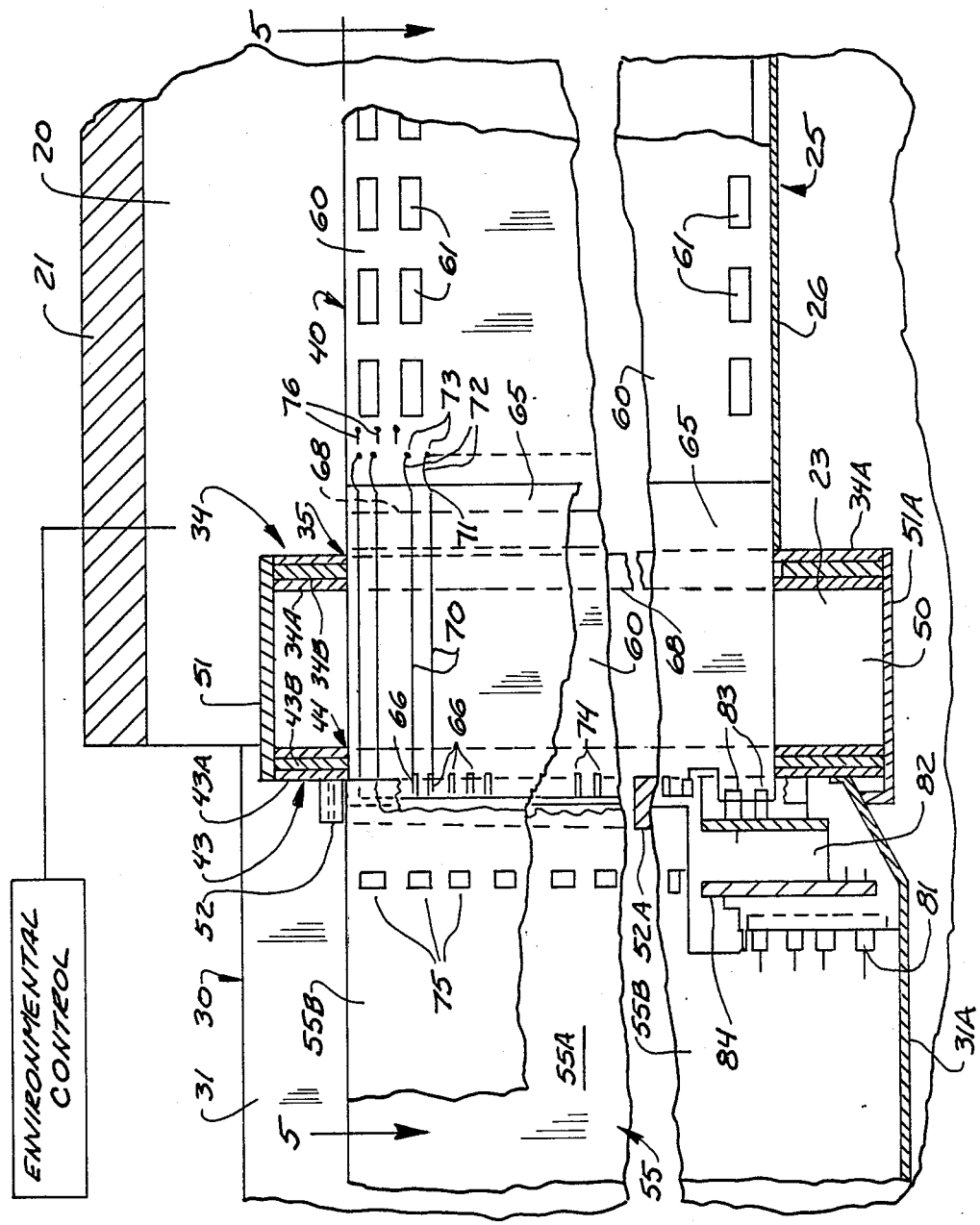
FIG. 4 is a fragmentary side view of a typical burn-in board arrangement, with parts in section and parts broken away, and viewed from an opposite side from the view shown in FIG. 3.

For power connection between the driver/receiver board and the burn-in boards, conventional connections are shown in FIG. 4. An edge connector 52A is used and a connector board 82 extends into connector 52A for coupling contacts 83 on the main and auxiliary boards 60 and 55 to power. The power is carried on contacts 81 on the respective driver/receiver boards 55A and 55B across a conventional back plane 84. The power connections are conventional except for use of the auxiliary board.

The burn-in operation provides a stimulation signal to each of the connectors or pins 61A of the circuit packages, which are generally digital devices, and the results of such stimulation are received by the controls to insure the circuit in the package is operating.

While a temperate zone or chamber is shown, many environmental chambers have card slots in a single exterior wall for permitting connections to be made to interior burn-in boards.

Although the present invention has been described with reference to preferred embodiments, workers skilled in the art will recognize that changes may be made in form and detail without departing from the spirit and scope of the invention.

What is claimed is:

1. A burn-in board assembly for providing signals to electronic circuit package components, said burn-in board assembly being useable in an environmental chamber having a plurality of slots extending through a wall thereof comprising a first planar board of size sufficient to mount a desired number of the components, each of said components having a plurality of signal connection means, said first board having a plurality of edge contacts adjacent one edge thereof and connected to a first plurality of said signal connection means, said first board having a first length extending along the plane of the board in a direction perpendicular to the length of the one edge thereof, and at least one second auxiliary board portion mounted to the first board adjacent the edge of the first board having said contacts thereon and being spaced from the first board by a distance sufficient so that when the first board is passed through a slot in the wall of an environmental chamber, the auxiliary board passes through an adjacent slot in such wall, the auxiliary board having edge contacts aligning with the contacts of the first board and connected to a second plurality of signal connection means on the first board, the auxiliary board being substantially shorter than the first board in direction of the first length.

2. The apparatus as specified in claim 1 wherein said chamber has first and second walls leading therefrom, with a space therebetween, each of the first and second walls having slots for receiving the board assembly, the slots in said first and second walls being in alignment, and both the first board and the auxiliary board spanning the first and second walls and having the contacts thereon positioned to the exterior of the second wall, the components to receive signals through contacts on the burn-in board assembly being mounted solely on the first board.

3. The apparatus as specified in claim 2 wherein separate independent driver boards are coupled to the contacts on the first board and the auxiliary board, respectively, to permit programming of the signals received by components on the first board through the contacts on both the main board and the auxiliary board.

4. The apparatus as specified in claim 1 wherein said auxiliary board is mounted to the first board using a standoff block member fixed to the first board and spacing the auxiliary board from the first board, and also which standoff block member is fixed to the auxiliary board, said standoff block member being positioned on an interior of a wall of an environmental chamber through which the edge of the board assembly extends when the contacts on the first and auxiliary boards are on an exterior of an environmental chamber in which the burn-in board assembly is mounted.

5. In a burn-in board assembly for providing signals to electronic components such as circuits contained in circuit packages, wherein the boards are mounted in an environmental chamber having a plurality of slots extending through a wall thereof, the improvement comprising a first board on which the components to receive signals are mounted, said components having a plurality of connections, said first board having contacts adjacent one edge thereof connected to a first plurality of said connections, and at least one second auxiliary board portion fixed to the first board adjacent the edge of the first board having said contacts thereon, the auxiliary board being spaced from the first board by a distance sufficient so that when the first board is passed through a slot in a wall of an environmental chamber, the auxiliary board passes through an adjacent slot in such wall, the auxiliary board having edge contacts on an edge thereof substantially aligning with the edge of the first board having the contacts thereon for substantially simultaneous connection to connectors on an exterior of the environmental chamber, said contacts on the auxiliary board being connected to connections of the components on the first board.

6. The apparatus as specified in claim 5 wherein the environmental chamber has first and second parallel walls on one side to define a temperate space therebetween, said first and second walls both having slots with planes in alignment, and both the first board and the auxiliary board spanning the first and second walls of such chamber and having the contacts on both such boards positioned to an exterior of the second wall.

7. The apparatus as specified in claim 5 and means for connecting separate independent driver/receiving boards to the contacts on the first board and on the auxiliary board, respectively, to permit programming of signals to components on the first board through the contacts on both the first board and the auxiliary board.

8. The apparatus as specified in claim 5 wherein said mounting means for mounting the auxiliary board on the first board comprises a standoff block member fixed to the first board for spacing the auxiliary board from the first board, the auxiliary board being fixed to the standoff block, said standoff block being positioned on the interior of the wall of an environmental chamber when the contacts on the first auxiliary boards are on the exterior of such an environmental chamber.

9. The apparatus of claim 5 wherein the contacts on the first board and auxiliary board substantially correspond in number and position to each other.

10. The apparatus of claim 9 wherein the edge contacts correspond in spacing and alignment to the spacing in standard card edge connectors.

* * * * *

UNITED STATES PATENT AND TRADEMARK OFFICE
CERTIFICATE OF CORRECTION

PATENT NO. : 4,900,948

DATED : February 13, 1990

INVENTOR(S) : Harold E. Hamilton

It is certified that error appears in the above-identified patent and that said Letters Patent is hereby corrected as shown below:

On the title page:

Under the References Cited Section add the following:

FOREIGN PATENT DOCUMENTS 2811775   10/78    Fed. Rep. of Germany .... G01 R

Signed and Sealed this

Twenty-ninth Day of January, 1991

Attest:

HARRY F. MANBECK, JR.

Attesting Officer

Commissioner of Patents and Trademarks